United States Patent
Lu et al.

(10) Patent No.: US 9,647,066 B2
(45) Date of Patent: May 9, 2017

(54) DUMMY FINFET STRUCTURE AND METHOD OF MAKING SAME

(75) Inventors: Chang-Shen Lu, New Taipei (TW);
Chih-Tang Peng, Taipei (TW);
Tai-Chun Huang, Hsin-Chu (TW);
Pei-Ren Jeng, Chu-Bei (TW);
Hao-Ming Lien, Hsin-Chu (TW);
Yi-Hung Lin, Taipei (TW); Tze-Liang Lee, Hsin-Chu (TW); Syun-Ming Jang, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 314 days.

(21) Appl. No.: 13/454,960

(22) Filed: Apr. 24, 2012

(65) Prior Publication Data
US 2013/0277760 A1 Oct. 24, 2013

(51) Int. Cl.
| | |
|---|---|
| *H01L 27/088* | (2006.01) |
| *H01L 29/10* | (2006.01) |
| *H01L 21/8234* | (2006.01) |
| *H01L 29/66* | (2006.01) |
| *H01L 29/78* | (2006.01) |
| H01L 21/20 | (2006.01) |

(52) U.S. Cl.
CPC ...... *H01L 29/10* (2013.01); *H01L 21/823431* (2013.01); *H01L 27/0886* (2013.01); *H01L 29/6681* (2013.01); *H01L 29/785* (2013.01)

(58) Field of Classification Search
CPC ... H01L 27/0207; H01L 21/845; H01L 21/20; H01L 21/28; H01L 21/31; H01L 21/82; H01L 21/8238; H01L 21/823821; H01L 21/336; H01L 27/088; H01L 27/092; H01L 27/10826; H01L 27/12; H01L 27/11; H01L 21/8234; H01L 29/6681; H01L 29/76; H01L 29/94; H01L 23/58; H01L 29/10; H01L 21/823431; H01L 27/0886; H01L 29/785

USPC ....... 257/401, 192, 288, 289, 351, 368, 369, 257/E27.112, E21.629, E27.098, E27.06, 257/E21.09; 438/192, 197, 296, 268, 438/285, 442

See application file for complete search history.

(56) References Cited

U.S. PATENT DOCUMENTS

| | | | |
|---|---|---|---|
| 6,756,643 B1 | 6/2004 | Achuthan et al. | |
| 6,974,729 B2 | 12/2005 | Collaert et al. | |
| 7,554,139 B2 * | 6/2009 | Inoue et al. | ................... 257/288 |
| 8,035,170 B2 | 10/2011 | Inaba | |
| 8,399,357 B2 | 3/2013 | Ogawa et al. | |

(Continued)

FOREIGN PATENT DOCUMENTS

| | | |
|---|---|---|
| KR | 20110033033 A | 3/2011 |
| KR | 2012-0035856 A | 4/2012 |

*Primary Examiner* — Natalia Gondarenko
(74) *Attorney, Agent, or Firm* — Slater Matsil, LLP

(57) ABSTRACT

A FinFET device may include a dummy FinFET structure laterally adjacent an active FinFET structure to reduce stress imbalance and the effects of stress imbalance on the active FinFET structure. The FinFET device comprises an active FinFET comprising a plurality of semiconductor fins, and a dummy FinFET comprising a plurality of semiconductor fins. The active FinFET and the dummy FinFET are laterally spaced from each other by a spacing that is related to the fin pitch of the active FinFET.

20 Claims, 13 Drawing Sheets

(56) References Cited

U.S. PATENT DOCUMENTS

| | | | |
|---|---|---|---|
| 2007/0045736 A1* | 3/2007 | Yagishita | 257/347 |
| 2008/0203540 A1* | 8/2008 | Anderson et al. | 257/629 |
| 2008/0283925 A1* | 11/2008 | Berthold et al. | 257/368 |
| 2009/0057781 A1* | 3/2009 | Anderson et al. | 257/401 |
| 2009/0101977 A1* | 4/2009 | Iwamatsu et al. | 257/347 |
| 2009/0209092 A1* | 8/2009 | Sonsky et al. | 438/479 |
| 2009/0230483 A1* | 9/2009 | Mizumura | H01L 21/82343 257/401 |
| 2010/0028809 A1* | 2/2010 | Vanleenhove et al. | 430/312 |
| 2010/0072553 A1* | 3/2010 | Xu et al. | 257/369 |
| 2011/0068407 A1* | 3/2011 | Yeh et al. | 257/369 |
| 2012/0235240 A1* | 9/2012 | Dixit | H01L 21/845 257/351 |

\* cited by examiner

DUMMY FINFET STRUCTURE AND METHOD OF MAKING SAME

BACKGROUND

Transistors are key components of modern integrated circuits. To satisfy the requirements of increasingly faster speed, the drive currents of transistors need to be increasingly greater. Since the drive currents of transistors are proportional to gate widths of the transistors, transistors with greater widths are preferred.

The increase in gate widths, however, conflicts with the requirements of reducing the sizes of semiconductor devices. Fin field-effect transistors (FinFET) were thus developed.

The introduction of FinFETs has the advantageous feature of increasing drive current without the cost of occupying more chip area. However, the small size of FinFET transistors raises numerous issues during their production and manufacturing.

BRIEF DESCRIPTION OF THE DRAWINGS

For a more complete understanding of the present embodiments, and the advantages thereof, reference is now made to the following descriptions taken in conjunction with the accompanying drawings, in which.

DETAILED DESCRIPTION OF ILLUSTRATIVE EMBODIMENTS

Figure 1:
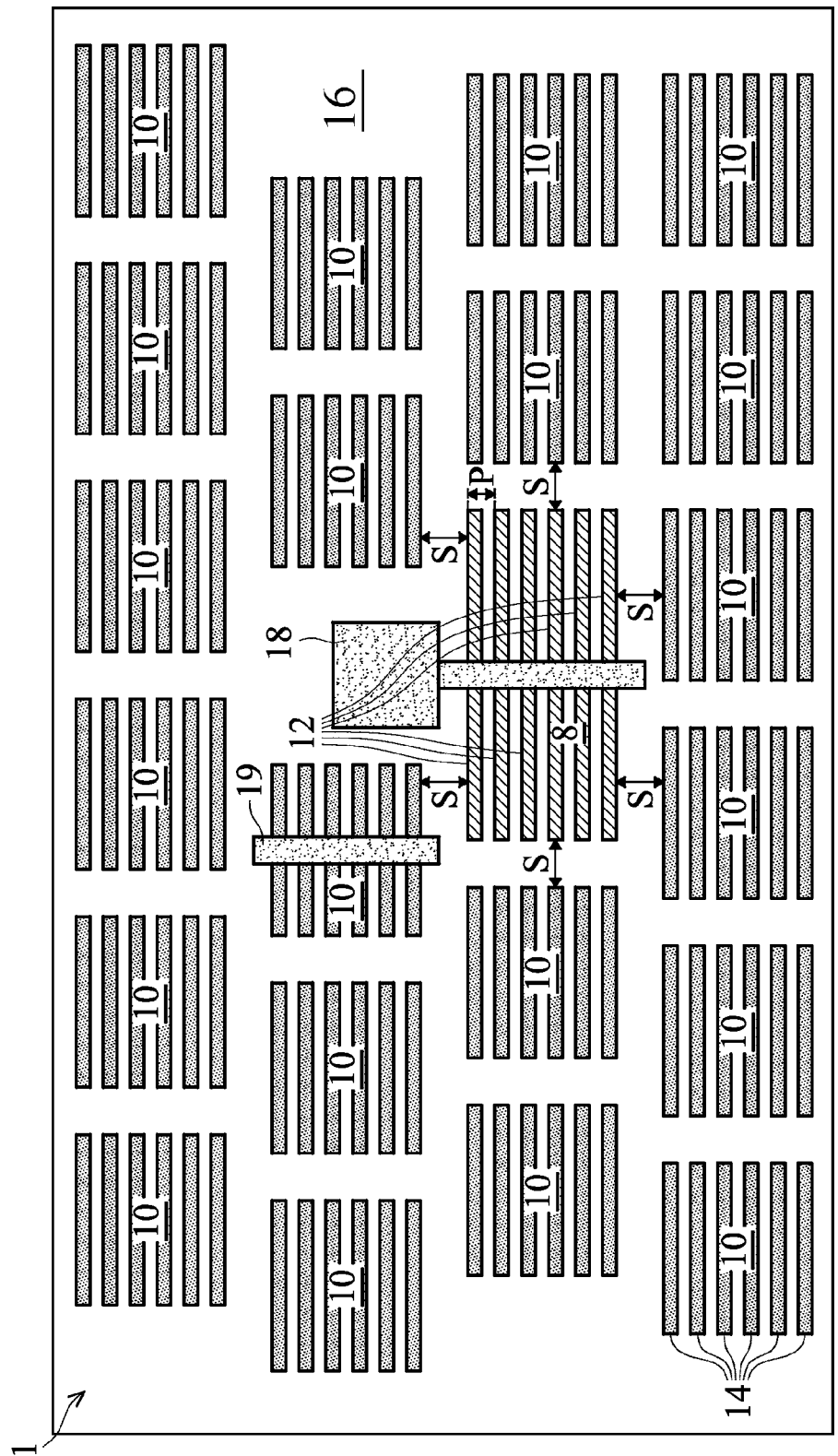
FIG. 1 illustrates in top-down view an illustrative embodiment of a FinFET device structure.

Various steps in the formation of a fin device will be described with reference to FIGS. 2a through 6b. Reference will now be made in detail to embodiments illustrated in the accompanying drawings. Wherever possible, the same reference numbers are used in the drawings and the description to refer to the same or like parts. In the drawings, the shape and thickness may be exaggerated for clarity and convenience. This description will be directed in particular to elements forming part of, or cooperating more directly with, methods and apparatus in accordance with the present disclosure. It is to be understood that elements not specifically shown or described may take various forms well known to those skilled in the art. Many alternatives and modifications will be apparent to those skilled in the art, once informed by the present disclosure.

Reference throughout this specification to "one embodiment" or "an embodiment" means that a particular feature, structure, or characteristic described in connection with the embodiment is included in at least one embodiment. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments. It should be appreciated that the following figures are not drawn to scale; rather, these figures are merely intended for illustration.

FIG. 1 illustrates a top-down view of a FinFET device 1, which includes an active FinFET 8 and a plurality of dummy FinFETs 10. The active FinFET 8 includes a plurality of active fins 12 and a gate structure 18, and the dummy FinFETs include dummy fins 14. In some embodiments, the dummy FinFETs 10 may include dummy gate structures 19 over the dummy fins 14.

In the embodiment in FIG. 1, the active fins 12 are rectangular and are substantially parallel to each other with the gate structure 18 being perpendicular to the active fins 12. Also in this embodiment, the dummy fins 14 are substantially parallel to the active fins 12. In addition, the dummy fins 14 are of similar size and shape as the active fins 12. Alternatively, the dummy fins 14 may be oriented in any direction in relation to the active fins 12 (discussed below with reference to FIG. 8). Furthermore, the dummy fins 14 may be substantially larger or smaller than the active fins 12 and may be of various shapes (discussed below with reference to FIGS. 7 and 8).

Figure 3A:
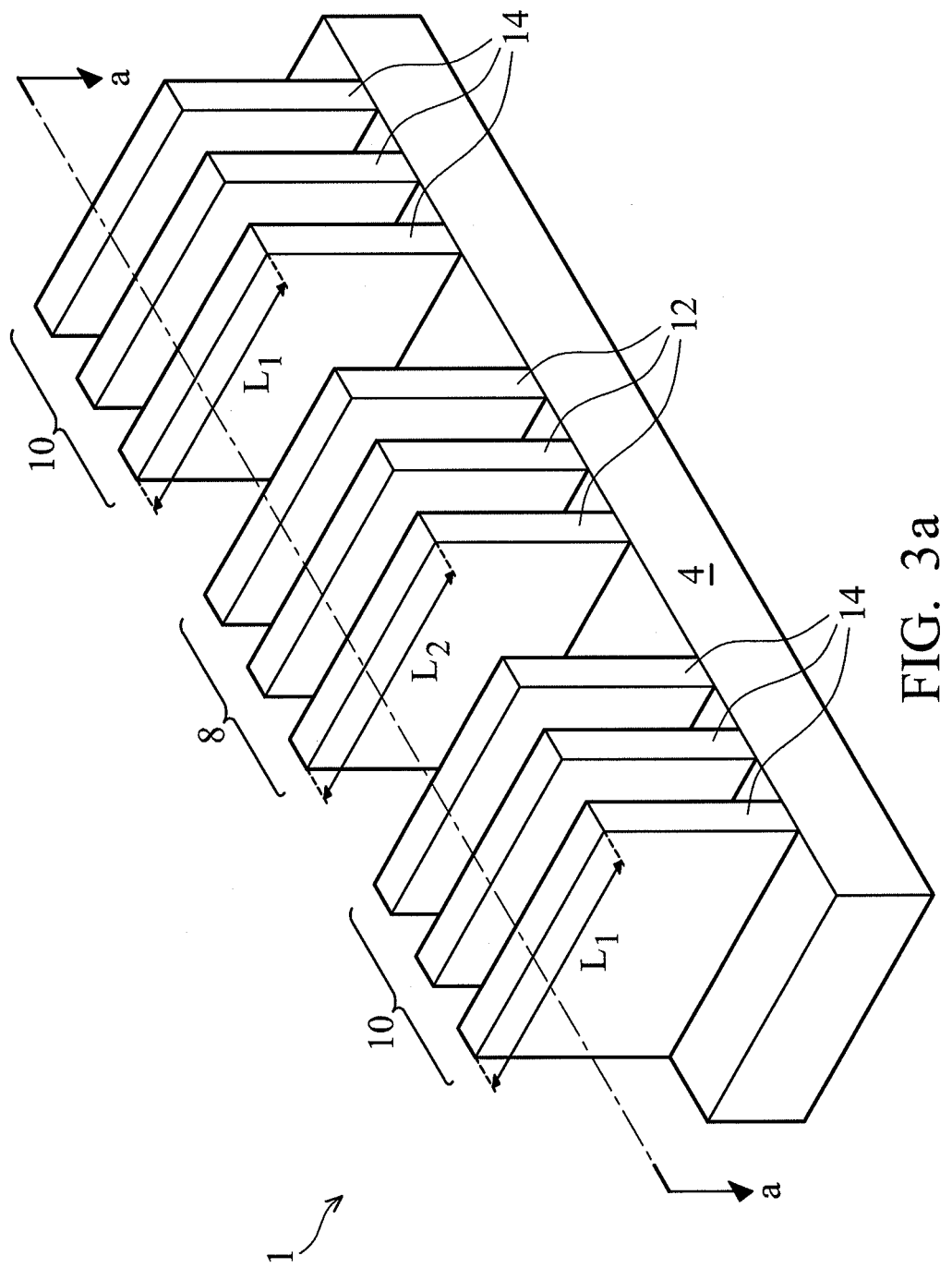
Figure 3B:
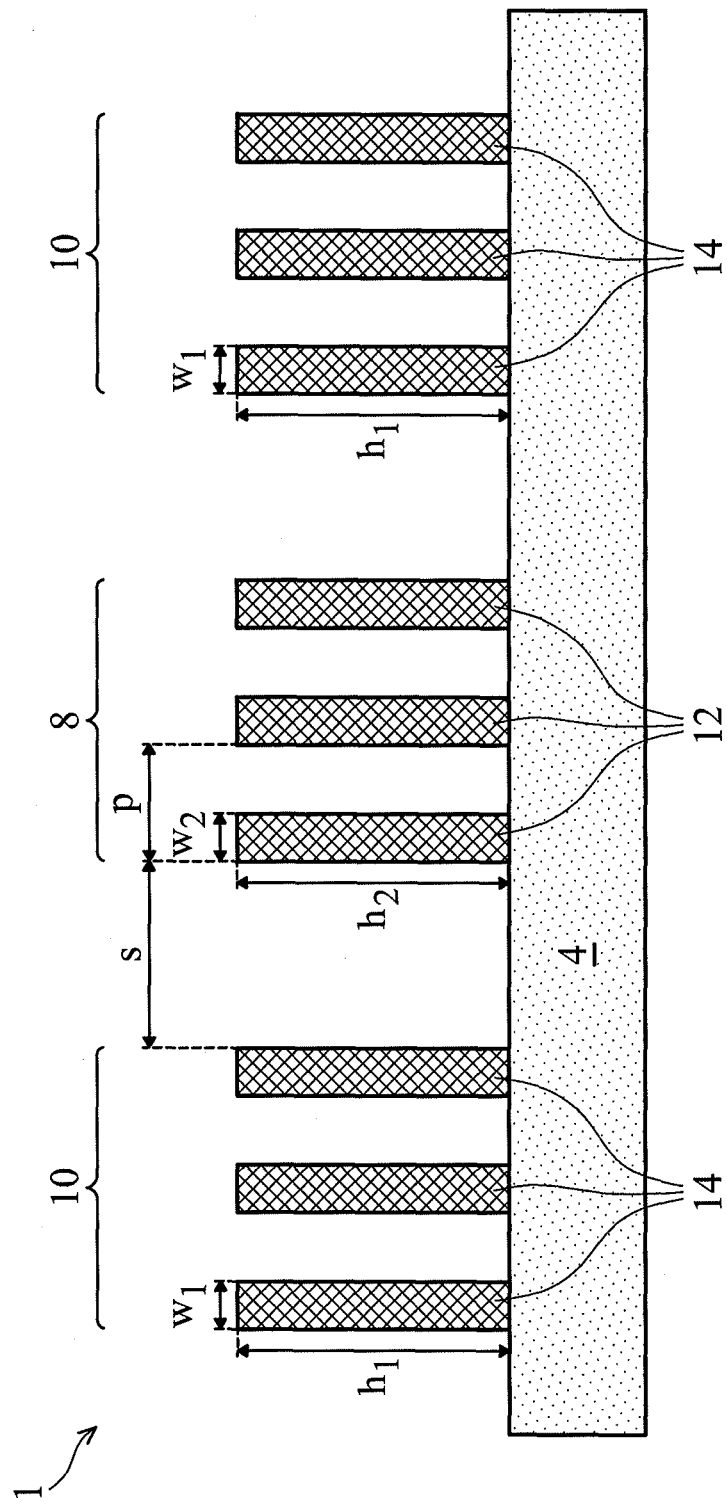

As shown in FIG. 1, the FinFET device 1 includes an active fin pitch p and a spacing s (see also FIG. 3b). The active fin pitch p is the width $w_2$ (see FIG. 3b) of a single active fin 12 and the distance between the single active fin 12 and the next active fin 12. For example, if the width $w_2$ is 10 nm and the distance between active fins 12 is 20 nm, then the active fin pitch p would be 30 nm. The active FinFET 8 is separated from the nearest dummy FinFETs 10 by a spacing s. The spacing s may be defined in terms of the active fin pitch p. In illustrative embodiments, s may be between about 0.1p and 5p. For example, using the active fin pitch of 30 nm from the example above, the spacing s may be between about 3 nm and 150 nm.

Figure 2A:
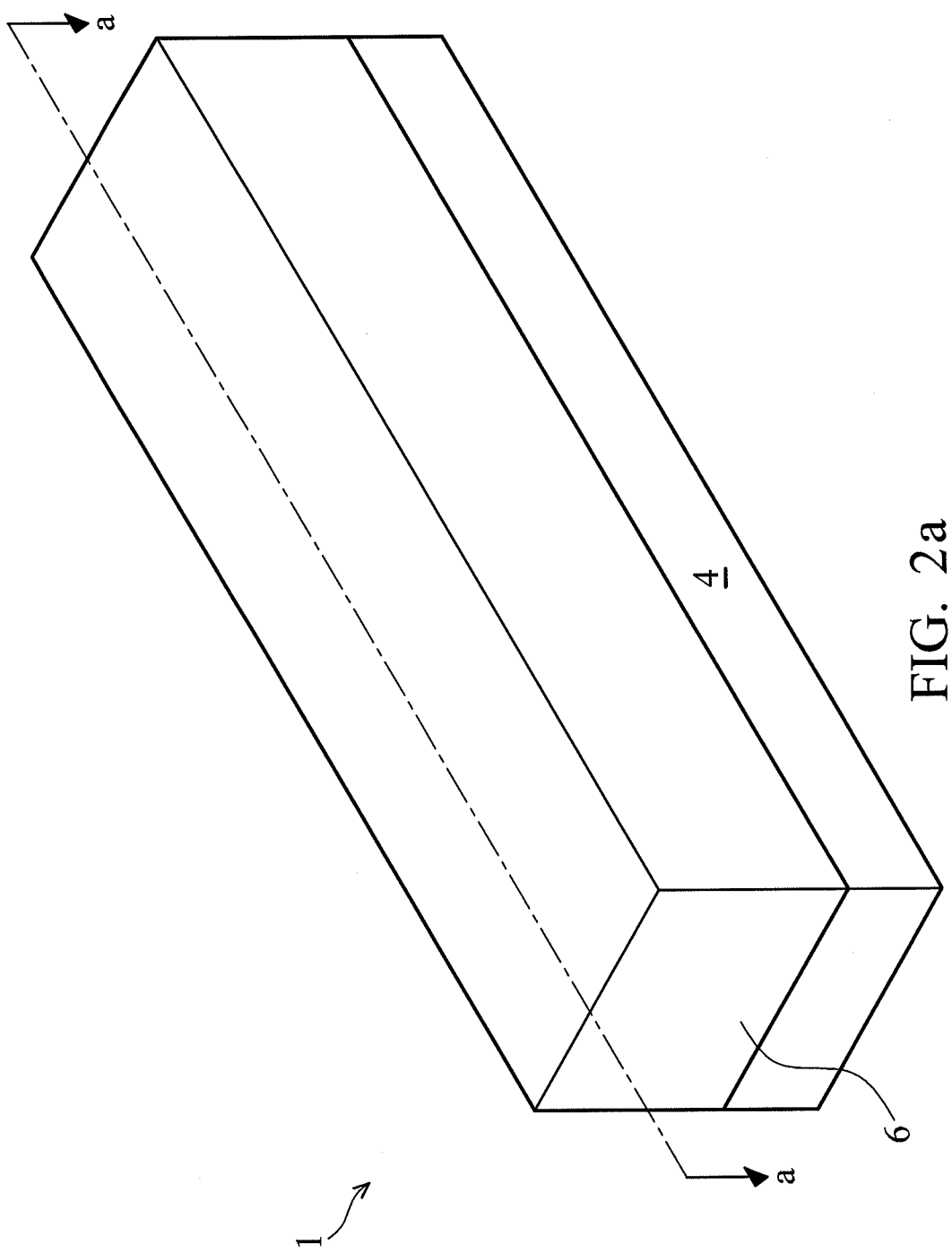
FIGS. 2a through 6b illustrate in perspective view and cross-sectional view, respectively, various stages in the manufacture of the FinFET device illustrated in FIG. 1.
Figure 2B:
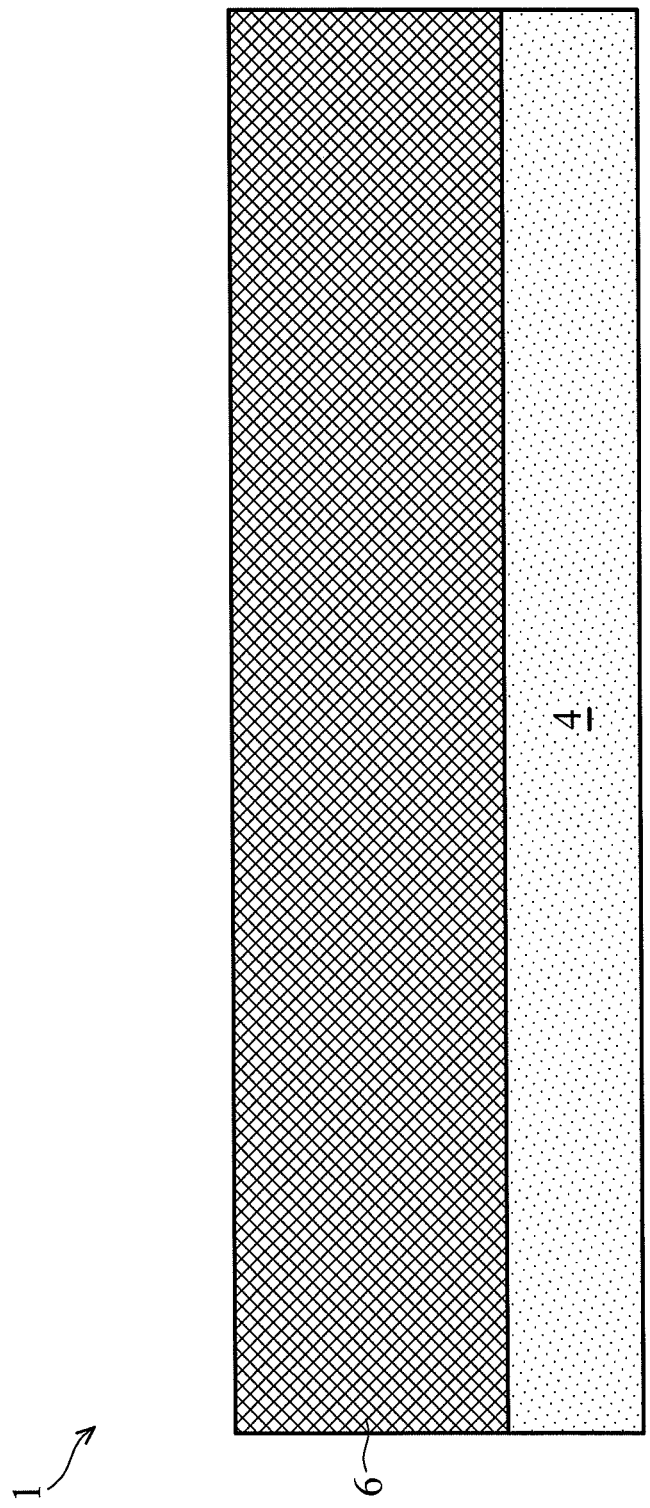

FIG. 2a illustrates a perspective view of the FinFET device 1 at an intermediate stage of processing. FIG. 2b illustrates a cross-sectional view of the FinFET device along the a-a line of FIG. 2a. The FinFET device 1 includes a semiconductor layer 6 on a semiconductor substrate 4. The semiconductor substrate 4 may comprise bulk silicon, doped or undoped, or an active layer of a silicon-on-insulator (SOI) substrate. Generally, an SOI substrate comprises a layer of a semiconductor material such as silicon, germanium, silicon germanium, SOI, silicon germanium on insulator (SGOI), or combinations thereof. Other substrates that may be used include multi-layered substrates, gradient substrates, or hybrid orientation substrates.

The semiconductor substrate 4 may include active devices (not shown in FIG. 2a or 2b for clarity). As one of ordinary skill in the art will recognize, a wide variety of devices such as transistors, capacitors, resistors, combinations of these, and the like may be used to generate the structural and functional requirements of the design for the FinFET device 1. The devices may be formed using any suitable methods. The active FinFET 8 may be electrically coupled to the active and passive devices. The dummy FinFETs 10 may be electrically isolated from the active and passive devices. Only a portion of the semiconductor substrate 4 is illustrated in the figures, as this is sufficient to fully describe the illustrative embodiments.

The semiconductor layer 6 may be formed of semiconductor material such as silicon, germanium, silicon germanium, or the like. In an embodiment, the semiconductor layer 6 is silicon. The semiconductor layer 6 may then doped through an implantation process to introduce p-type or n-type impurities into the semiconductor layer 6.

In FIGS. 3a and 3b, the patterning of the semiconductor layer 6 into the active fins 12 and the dummy fins 14 is illustrated. FIG. 3a is a perspective view of FinFET device 1 and FIG. 3b is a cross-sectional view along line a-a in FIG. 3a. The fin patterning process may be accomplished by depositing mask material (not shown) such as photoresist or silicon oxide over the semiconductor layer 6. The mask material is then patterned and the semiconductor layer 6 is etched in accordance with the pattern. The resulting structure includes a plurality of active fins 12 and dummy fins 14 formed in the semiconductor layer 6. Each fin of the plurality of active fins 12 and dummy fins 14 has a sidewall being substantially orthogonal to a top surface of the semiconductor substrate 4. In some embodiments, the semiconductor layer 6 is etched to a specific depth, meaning the active fins 12 and the dummy fins 14 are formed to a height, the active fins 12 height $h_2$ from about 10 nm to about 500 nm and the dummy fins 14 height $h_1$ from about 10 nm to 500 nm. In one specific embodiment, the active fins 12 are formed to a height $h_2$ of about 150 nm and the dummy fins 14 are formed to a height $h_1$ of about 150 nm. The active fins 12 may have a width $w_2$ from about 5 nm to 50 nm and the dummy fins 14 may have a width $w_1$ from about 5 nm to 50 nm. As shown in FIG. 3a, the active fins 12 may have a length $L_1$ from about 0.01 um to 10 um and the dummy fins 14 may have a length $L_1$ from about 0.1 um to 10 um. In an alternative embodiment, active fins 12 and dummy fins 14 may be epitaxially grown from a top surface of the semiconductor substrate 4 within trenches or openings formed in a patterned layer atop the semiconductor substrate 4. Because the process is known in the art, the details are not repeated herein.

Figure 7:
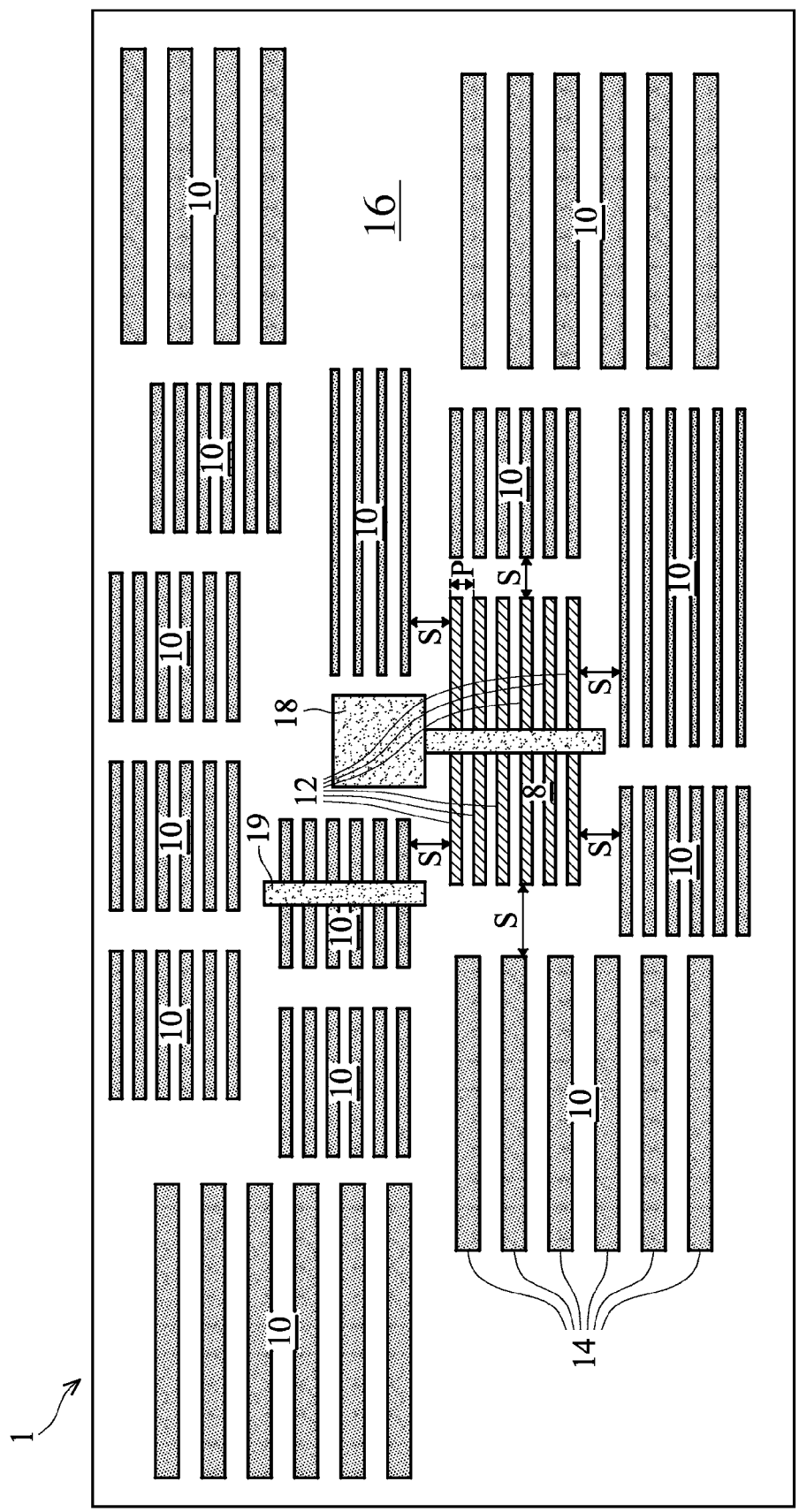
FIG. 7 illustrates in top-down view a second illustrative embodiment of a FinFET device structure.
Figure 8:
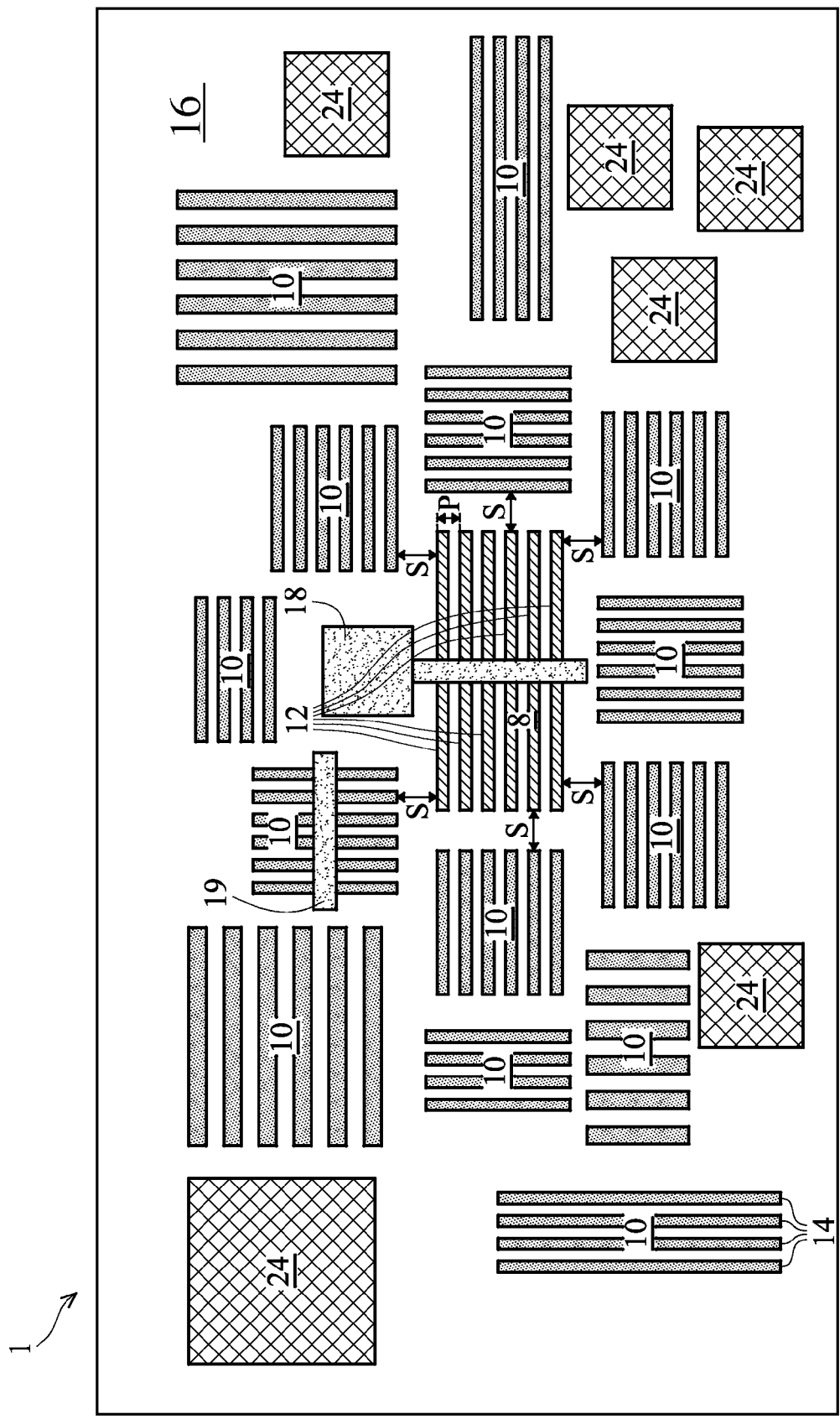
FIG. 8 illustrates in top-down view a third illustrative embodiment of a FinFET device structure.

The active fins 12 serve as the fin structure for the to-be-formed active FinFET 8 and the dummy fins 14 serve as the fin structure for the dummy FinFETs 10. The active FinFET 8 may comprise a single active fin 12 to as many active fins 12 as necessary for the FinFET device 1. FIGS. 2a through 6b illustrate the formation of an active FinFET 8 with three active fins 12 as a non-limiting illustrative embodiment. As such, FIGS. 1, 7, and 8 illustrate an active FinFET 8 with six active fins 12. Similarly, the dummy FinFETs 10 may comprise a single dummy fin 14 to approximately 500 dummy fins 14 rather than the three dummy fins 14 illustrated in FIGS. 2a through 6b.

Figure 4A:
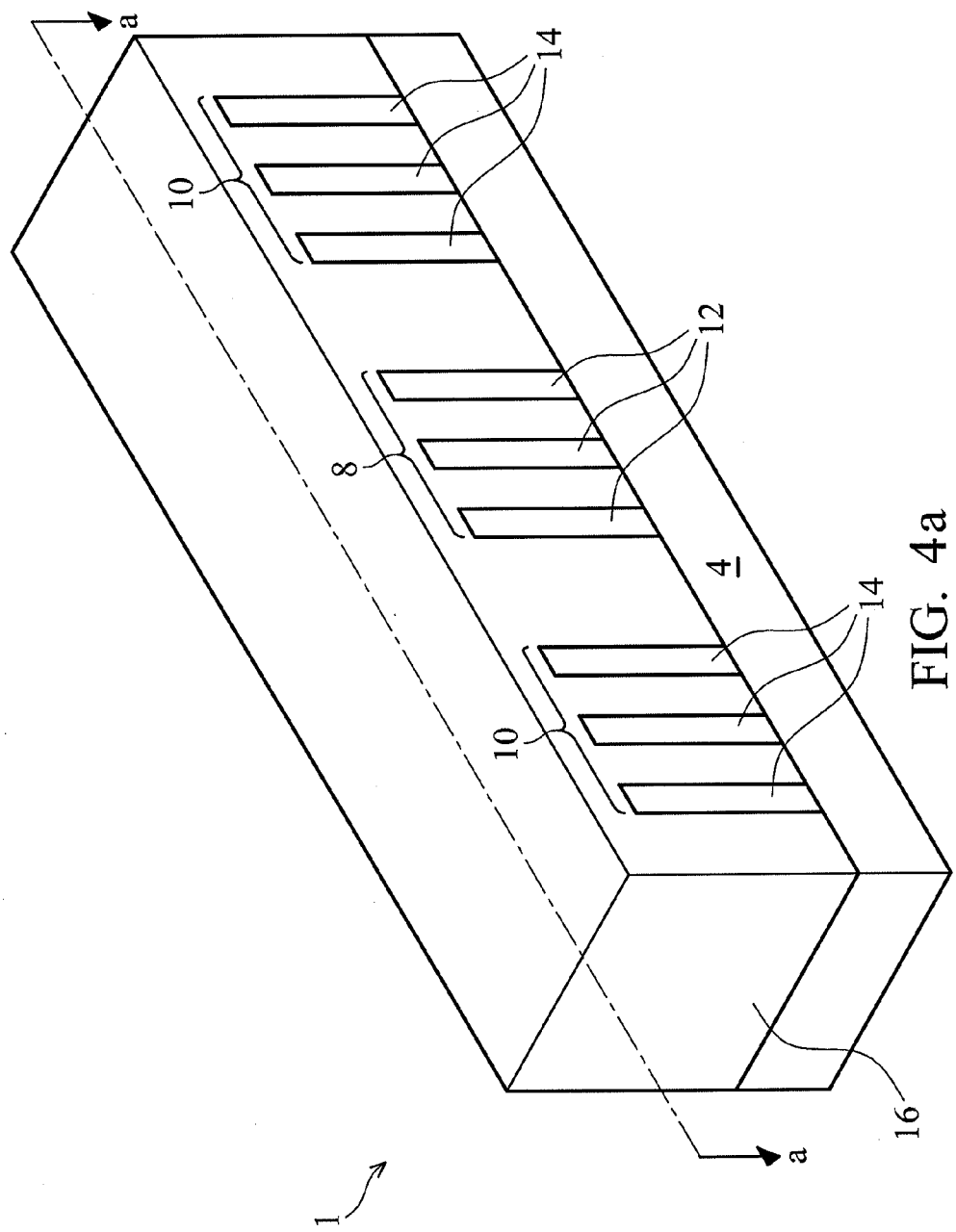
Figure 4B:
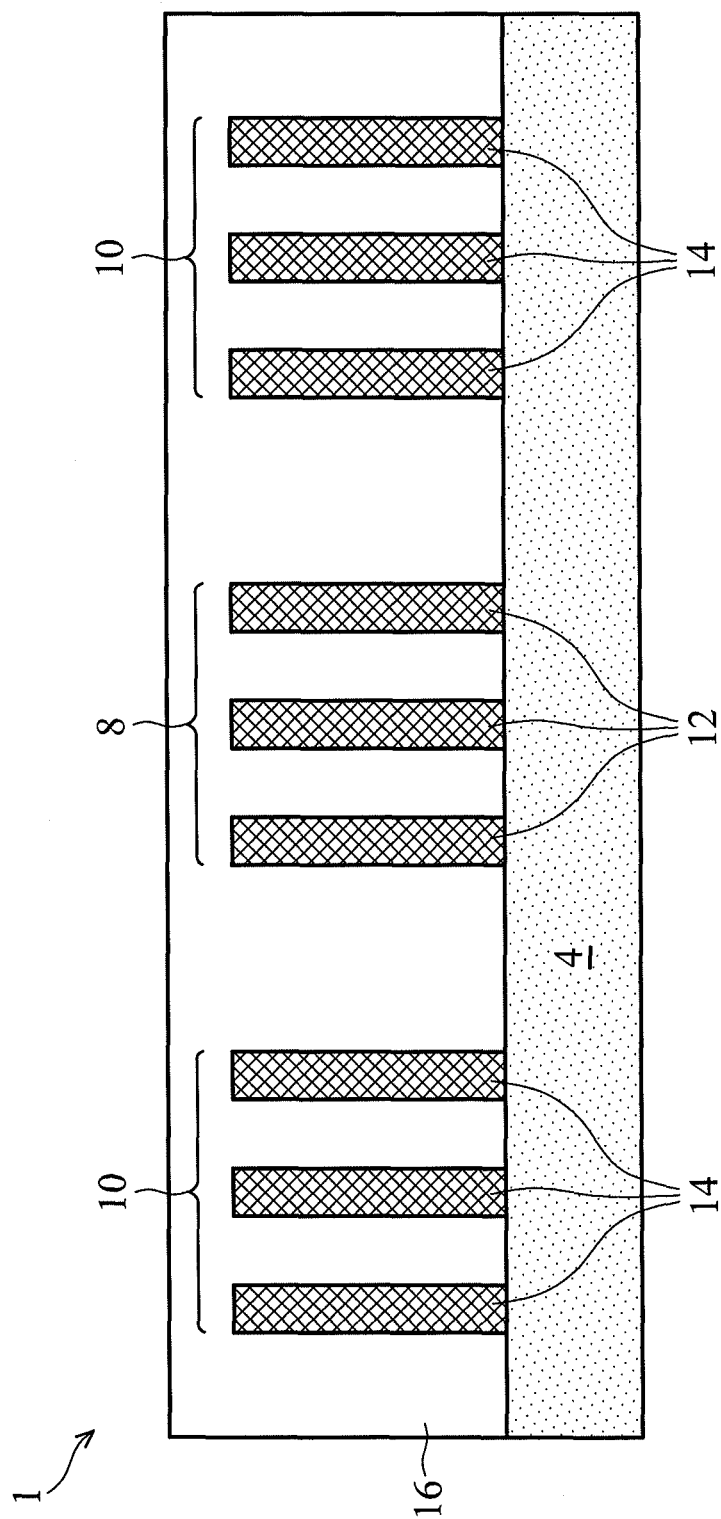

Referring now to FIGS. 4a and 4b, a dielectric layer 16 is blanket deposited on the FinFET device 1. The dielectric layer 16 may be made of one or more suitable dielectric materials such as silicon oxide, silicon nitride, low-k dielectrics such as carbon doped oxides, extremely low-k dielectrics such as porous carbon doped silicon dioxide, a polymer such as polyimide, combinations of these, or the like. The dielectric layer 16 may be deposited through a process such as chemical vapor deposition (CVD), or a spin-on-glass process, although any acceptable process may be utilized.

In the embodiment illustrated in FIGS. 4a and 4b, the active fins 12 have a dielectric layer 16 between them. The dielectric layer 16 may comprise a material with gap-fill capability on smaller devices but also with a high shrinkage rate such as a spin-on-glass, a flowable CVD oxide, or the like. When the dielectric layer 16 is heated and cooled by the subsequent processes with a high thermal budget, it may result in a stress imbalance in the active fins 12 which may cause deformation or defects, such as lateral displacement, in the active fins 12. The deformation and/or defects may impact the performance of the active FinFET 8.

The inventors have discovered that the stress imbalance and the effects of the stress imbalance may be reduced by the inclusion of dummy FinFETs 10 surrounding the active FinFET 8. It is believed that a value of the spacing s, the distance from the active FinFET 8 to the nearest dummy FinFET 10, from about 0.1 times the fin pitch p to 5 times the fin pitch p provides for a reduction of the stress imbalance and its effects on the active FinFET 8. It has been shown that the lateral displacement may be reduced up to 15% by the inclusion of the dummy FinFETs 10 surrounding the active FinFET 8 and spaced from the active FinFET 8 a distance within the range described above. In addition, the stress imbalance causes a high von Mises stress on the outermost active fins 12 of the active FinFET 8 near the base of the fin where the substantially vertical sidewall of the fin meets the top surface of the substrate. The von Mises stress on the outer edge of the outermost active fin 12 (in the direction of the dummy FinFET 10) may be reduced by up to 59% with the inclusion of dummy FinFETs as compared to an active FinFET 8 with no dummy FinFETs 10 nearby. Also, the von Mises stress on the inner edge of the outermost active fin 12 (in the direction of the adjacent active fin 12) may be reduced by up to 46% with the inclusion of with the inclusion of dummy FinFETs as compared to an active FinFET 8 with no dummy FinFETs 10 nearby. This reduction of the von Mises stress on the active fins 12 may reduce the deformation and defects of the active fins 12 as a result of the stress imbalance caused by the shrinkage of the dielectric layer 16 from the heating and cooling of the subsequent processing.

Figure 5A:
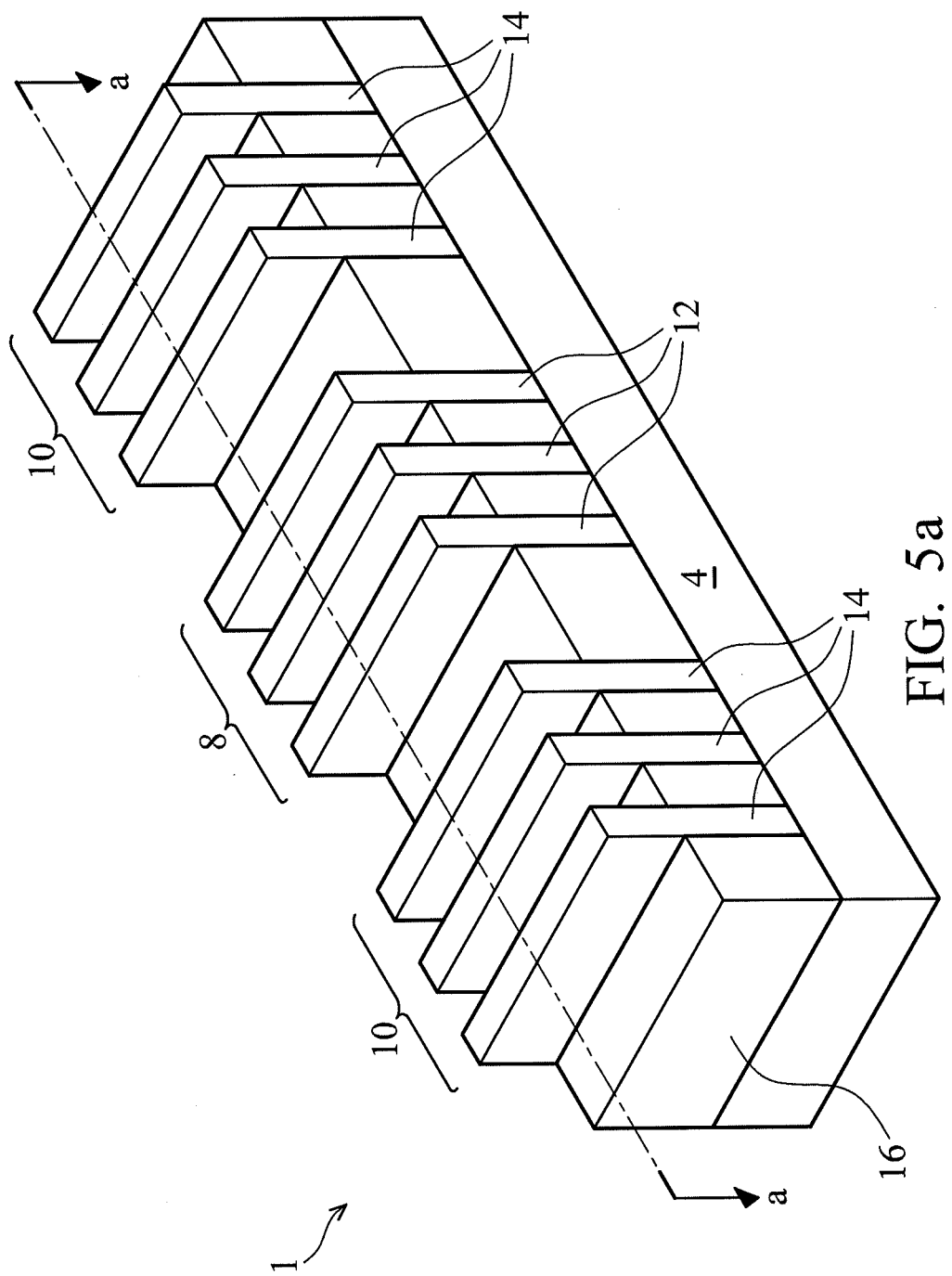
Figure 5B:
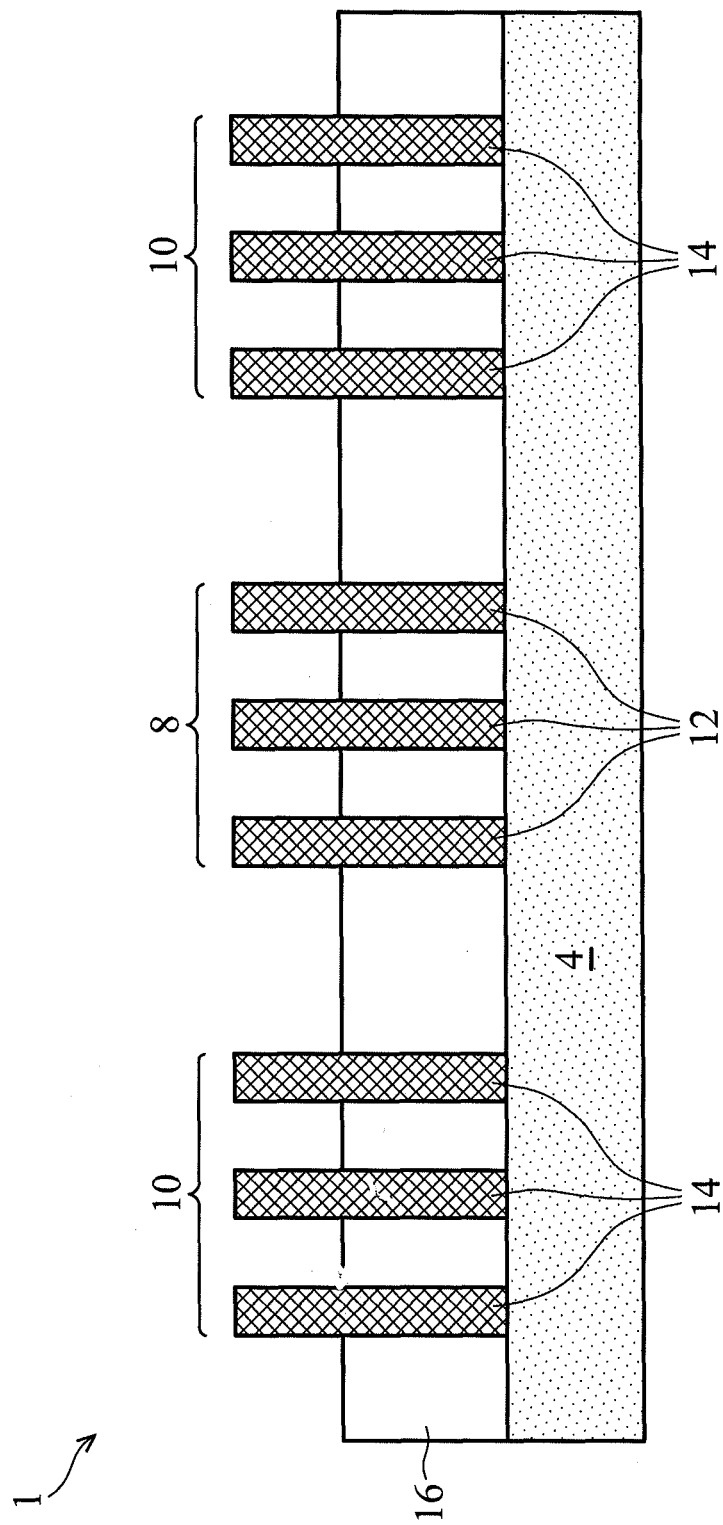

FIGS. 5a and 5b illustrate the next step in the manufacturing process, wherein the dielectric layer 16 is thinned to below the level of the tops of the active fins 12 and the tops of the dummy fins 14. The dielectric layer 16 may be thinned back in a variety of ways. In one embodiment, this is a multi-step process with the first step involving a chemical mechanical polishing (CMP), in which the dielectric layer 16 is reacted and then ground away using an abrasive. This process may continue until the tops of the active fins 12 and the dummy fins 14 are exposed. The next step of thinning the dielectric layer 16 below the tops of the active fins 12 and dummy fins 14 may be performed in a variety of ways. One such way is by a diluted hydrofluoric acid (DHF) treatment or a vapor hydrofluoric acid (VHF) treatment for a suitable time. In another embodiment, the CMP process step may be skipped and the dielectric layer 16 may be selectively thinned back without removing the active fins 12 and the dummy fins 14. This selective thinning may be performed by the DHF treatment or the VHF treatment described above.

Figure 6A:
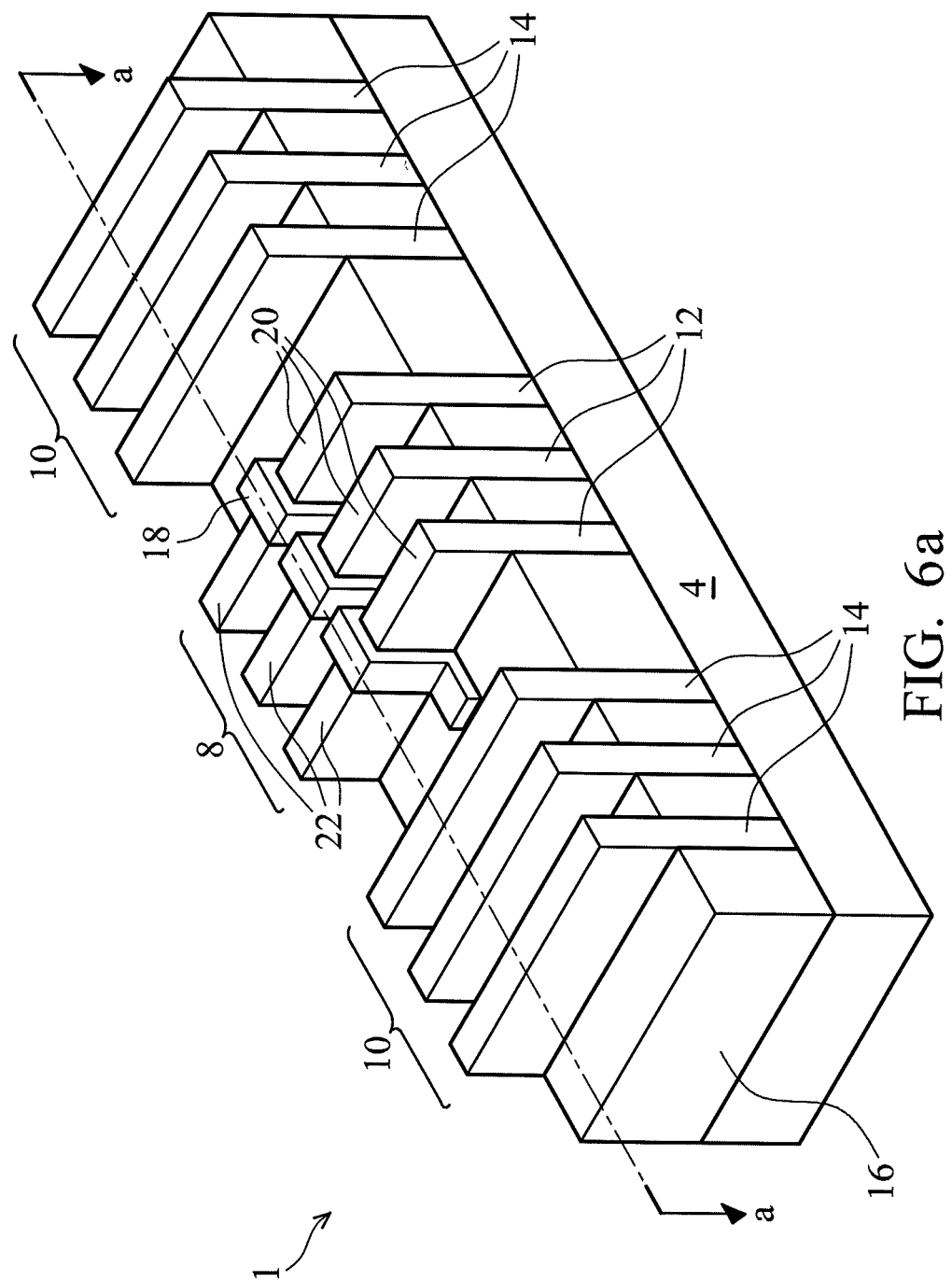
Figure 6B:
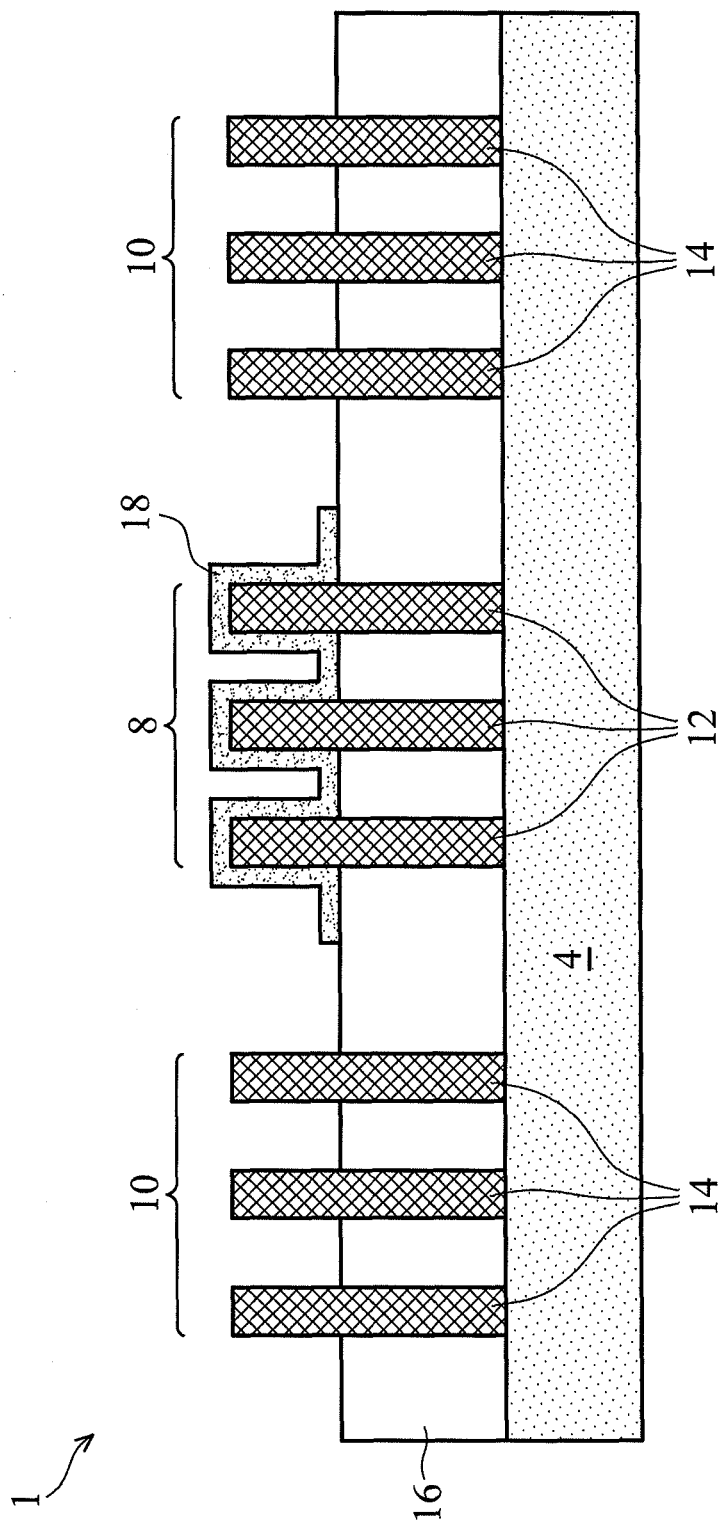

FIGS. 6a and 6b illustrate the formation of the gate structure 18 (see also FIG. 1) over the active fins 12. The gate structure 18 may include a gate dielectric layer (not shown), a gate electrode (not shown), and gate spacers (not shown). The gate dielectric layer may be formed by thermal oxidation, CVD, sputtering, or any other methods known and used in the art for forming a gate dielectric. In other embodiments, the gate dielectric layer includes dielectric materials having a high dielectric constant (k value), for example, greater than 3.9. The materials may include silicon nitrides, oxynitrides, metal oxides such as $HfO_2$, $HfZrO_x$, $HfSiO_x$, $HfTiO_x$, $HfAlO_x$, the like, or combinations and multi-layers thereof.

The gate electrode layer may be formed over the gate dielectric layer. The gate electrode layer may comprise a conductive material and may be selected from a group comprising polycrystalline-silicon (poly-Si), poly-crystalline silicon-germanium (poly-SiGe), metallic nitrides, metallic silicides, metallic oxides, and metals. The gate electrode layer may be deposited by CVD, sputter deposition, or other techniques known and used in the art for depositing conductive materials. The top surface of the gate electrode layer usually has a non-planar top surface, and may be planarized prior to patterning of the gate electrode layer or gate etch. Ions may or may not be introduced into the gate electrode layer at this point. Ions may be introduced, for example, by ion implantation techniques. The gate electrode layer and the gate dielectric layer may be patterned to form the gate structure 18. The gate patterning process may be accomplished by depositing mask material (not shown) such as photoresist or silicon oxide over the gate electrode layer. The mask material is then patterned and the gate electrode layer is etched in accordance with the pattern. In some embodiments, the dummy FinFETs 10 may have dummy gate structures 19 formed over the dummy fins 14. Alternatively, in other embodiments, the dummy FinFETs 10 may not have dummy gate structures 19 formed over the dummy fins 14.

After the formation of gate structure 18, source regions 20 and the drain regions 22 may be formed on the active fins 12. The source regions 20 and the drain regions 22 may be doped by performing implanting process to implant appropriate dopants to complement the dopants in the active fins 12. In another embodiment, the source regions 20 and the drain regions 22 may be formed by forming recesses (not shown) in active fins 12 and epitaxially growing material in the recesses. The source regions 20 and the drain regions 22 may be doped either through an implantation method as discussed above, or else by in-situ doping as the material is grown. In an embodiment, a continuous metal layer may overly the three source regions 20 of the active fins 12 to form a source region of the active FinFET 8. Further, a continuous metal layer may overly the three drain regions 22 to form a drain region of the active FinFET 8.

Gate spacers may be formed on opposite sides of the gate structure 18. The gate spacers (not shown) are typically formed by blanket depositing a spacer layer (not shown) on the previously formed structure. The spacer layer may comprise SiN, oxynitride, SiC, SiON, oxide, and the like and may be formed by methods utilized to form such a layer, such as chemical vapor deposition (CVD), plasma enhanced CVD, sputter, and other methods known in the art. The gate spacers are then patterned, preferably by anisotropically etching to remove the spacer layer from the horizontal surfaces of the structure.

FIG. 7 illustrates another embodiment of FinFET device 1 wherein the dummy FinFETs 10 are of various sizes. Similar to the embodiment in FIG. 1, the active fins 12 are rectangular and are substantially parallel to each other with the gate structure 18 being perpendicular to the active fins 12. Also similar to the embodiment in FIG. 1, the dummy fins 14 are substantially parallel to the active fins 12. However, in this embodiment, some of the dummy fins 14 are longer, wider, narrower, or shorter than the active fins 12.

Similar to the embodiment in FIG. 1, the FinFET device 1 includes an active fin pitch p and a spacing s (see also FIGS. 1 and 3b). The active fin pitch p is the width $w_2$ (see FIG. 3b) of a single active fin 12 and the distance between the single active fin 12 and the next active fin 12. The active FinFET 8 is separated from the nearest dummy FinFETs 10 by a spacing s. The spacing s may be defined in terms of the active fin pitch p. In illustrative embodiments, s may be between about 0.1p and 5p.

FIG. 8 illustrates yet another embodiment of the FinFET device 1 including dummy FinFETs 10 and dummy sections 24. Similar to the embodiments in FIGS. 1 and 7, the active fins 12 are rectangular and are substantially parallel to each other with the gate structure 18 being perpendicular to the active fins 12. Also similar to the embodiment in FIG. 7, some of the dummy fins 14 are longer, wider, narrower, or shorter than the active fins 12. However, in this embodiment the dummy fins 14 are also oriented in different directions. The dummy fins 14 may be oriented substantially parallel to the active fins 12, or the dummy fins 14 may be oriented substantially perpendicular to the active fins 12. In addition, this embodiment includes dummy sections 24 with the dummy FinFETs 10. In another embodiment, dummy fins 14 may be oriented in directions that are neither substantially parallel nor substantially perpendicular to the active fins 12, for example, the dummy fins 14 may be diagonal to the active fins 12. The dummy sections 24 may be formed of similar material and by a similar process as the dummy FinFETs 10. Although the dummy sections 24 are illustrated in FIG. 8 as squares and rectangles, they may be formed of any suitable shape.

Similar to the embodiments in FIGS. 1 and 7, the FinFET device 1 includes an active fin pitch p and a spacing s (see also FIGS. 1 and 3b). The active fin pitch p is the width $w_2$ (see FIG. 3b) of a single active fin 12 and the distance between the single active fin 12 and the next active fin 12. The active FinFET 8 is separated from the nearest dummy FinFETs 10 by a spacing s. The spacing s may be defined in terms of the active fin pitch p. In illustrative embodiments, s may be between about 0.1p and 5p.

An embodiment is a semiconductor device comprising an active FinFET over a substrate, wherein the active FinFET comprises one or more active semiconductor fins, the active FinFET having four sides; a first dummy FinFET over the substrate, wherein the first dummy FinFET comprises one or more dummy semiconductor fins, the first dummy FinFET laterally adjacent a first side of the active FinFET; and a second dummy FinFET over the substrate, wherein the second dummy FinFET comprises one or more dummy semiconductor fins, the second dummy FinFET laterally adjacent a second side of the active FinFET. The semiconductor device further comprising a third dummy FinFET over the substrate, wherein the third dummy FinFET comprises one or more dummy semiconductor fins, the third dummy FinFET laterally adjacent a third side of the active FinFET; and a fourth dummy FinFET over the substrate, wherein the fourth dummy FinFET comprises one or more dummy semiconductor fins, the fourth dummy FinFET laterally adjacent a fourth side of the active FinFET.

Another embodiment is a FinFET device comprising a first FinFET over a substrate, the first FinFET comprising a first plurality of semiconductor fins, and the first FinFET electrically coupled to an active device; and a second FinFET over the substrate, the second FinFET comprising a second plurality of semiconductor fins, the second plurality of semiconductor fins perpendicular to the first plurality of semiconductor fins, and the second FinFET electrically isolated from all active devices.

Yet another embodiment is a method for forming a FinFET device, the method comprising forming a plurality of active semiconductor fins over a substrate; and at a same time as the forming the plurality of active semiconductor fins, forming a plurality of dummy semiconductor fins over the substrate, the plurality of dummy semiconductor fins comprising forming a first set of dummy semiconductor fins, wherein the first set are laterally adjacent a first side of the plurality of active semiconductor fins; forming a second set of dummy semiconductor fins, wherein the second set are laterally adjacent a second side of the plurality of active semiconductor fins; forming a third set of dummy semiconductor fins, wherein the third set are laterally adjacent a third side of the plurality of active semiconductor fins; and forming a fourth set of dummy semiconductor fins, wherein the fourth set are laterally adjacent a fourth side of the plurality of active semiconductor fins.

Although the present embodiments and their advantages have been described in detail, it should be understood that various changes, substitutions and alterations can be made herein without departing from the spirit and scope of the disclosure as defined by the appended claims. Moreover, the scope of the present application is not intended to be limited to the particular embodiments of the process, machine, manufacture, composition of matter, means, methods and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. A semiconductor device comprising:
   an active FinFET over a substrate, wherein the active FinFET comprises active semiconductor fins and an active gate structure over all of the active semiconductor fins, a first active semiconductor fin of the active semiconductor fins having a first longitudinal axis, each of the active semiconductor fins being perpendicular to the active gate structure and having a topmost surface that is co-planar with the topmost surface of each other active semiconductor fin, the active gate structure comprising at least one contact portion, and the active FinFET having four sides;
   a first dummy FinFET over the substrate, wherein the first dummy FinFET comprises a first plurality of dummy semiconductor fins, each dummy semiconductor fin of the first plurality of dummy semiconductor fins having a rectangular shape in a top-down view, being perpendicular to each of the active semiconductor fins, and having a topmost surface co-planar with the topmost surface of each of the active semiconductor fins, and wherein the first dummy FinFET further comprises a first dummy gate structure over all of the first plurality of dummy semiconductor fins, the first dummy gate structure being perpendicular to the active gate structure, the first dummy FinFET laterally adjacent a first side of the active FinFET, the first longitudinal axis intersecting at least one fin of the first plurality of dummy semiconductor fins;
   a second dummy FinFET over the substrate, wherein the second dummy FinFET comprises a second plurality of dummy semiconductor fins, each dummy semiconductor fin of the second plurality of dummy semiconductor fins having a rectangular shape in the top-down view and being perpendicular to each of the first plurality of dummy semiconductor fins, and wherein the second dummy FinFET further comprises a second dummy gate structure over all of the second plurality of dummy semiconductor fins, the second dummy FinFET laterally adjacent a second side of the active FinFET, the second side of the active FinFET being opposite the first side of the active FinFET, the first longitudinal axis intersecting at least one fin of the second plurality of dummy semiconductor fins;
   a third dummy FinFET over the substrate, wherein the third dummy FinFET comprises a third plurality of dummy semiconductor fins, the third dummy FinFET laterally adjacent a third side of the active FinFET;
   a fourth dummy FinFET over the substrate, wherein the fourth dummy FinFET comprises a fourth plurality of dummy semiconductor fins, the fourth dummy FinFET laterally adjacent a fourth side of the active FinFET, the fourth side of the active FinFET being opposite the third side of the active FinFET, each of the first, the second, the third, and the fourth dummy FinFETs being laterally separated from the active gate structure including the at least one contact portion, and no one active or dummy FinFET sharing a common gate structure with another active or dummy FinFET;
   a dielectric layer formed between each of the active semiconductor fins and each of the first, the second, the third, and the fourth plurality of dummy semiconductor fins, wherein the topmost surfaces of the active semiconductor fins, the first plurality of dummy semiconductor fins, and the second plurality of dummy semiconductor fins are higher than a topmost surface of the dielectric layer; and
   a further plurality of dummy fins formed to surround a space around the active FinFET, the space being defined by a spacing from the active FinFET on the first side, the second side, the third side, and at least partially on the fourth side of the active FinFET.

2. The semiconductor device of claim 1, wherein the active semiconductor fins are parallel to a plurality of dummy semiconductor fins of at least one of the first, the second, the third, and the fourth dummy FinFETs.

3. The semiconductor device of claim 1 further comprising:
   the first active semiconductor fin having a first width;
   a second active semiconductor fin, the second active semiconductor fin laterally spaced from the first active semiconductor fin by a first spacing; and
   a second spacing comprising the first width and the first spacing, wherein the active FinFET is laterally spaced from the first dummy FinFET, the second dummy FinFET, the third dummy FinFET, and the fourth dummy FinFET by a third spacing, the third spacing being from one tenth of the second spacing to five times the second spacing.

4. The semiconductor device of claim 1, wherein the active semiconductor fins have a same width and a same length as a plurality of dummy semiconductor fins.

5. The semiconductor device of claim 1, comprising a plurality of dummy semiconductor fins that are longer and wider than the active semiconductor fins.

6. The semiconductor device of claim 1, comprising a plurality of dummy semiconductor fins that are shorter and narrower than the active semiconductor fins.

7. A FinFET device comprising:
   a first FinFET over a substrate, the first FinFET comprising a first plurality of semiconductor fins and an active gate structure over and perpendicular to the first plurality of semiconductor fins, one fin of the first plurality of semiconductor fins having a first longitudinal axis, the first plurality of semiconductor fins consisting of all semiconductor fins under the active gate structure, each of the first plurality of semiconductor fins being parallel to each other of the first plurality of semiconductor fins, and the first FinFET being an active FinFET;
   a second FinFET over the substrate, the second FinFET comprising a second plurality of semiconductor fins and a first dummy gate structure over and perpendicular to the second plurality of semiconductor fins, each semiconductor fin of the second plurality of semiconductor fins having a rectangular shape in a top-down view, the second plurality of semiconductor fins consisting of all semiconductor fins under the first dummy gate structure, the second plurality of semiconductor fins being perpendicular to the first plurality of semiconductor fins, and the second FinFET being electrically isolated from all active devices, the second FinFET being nearer to a first side of the first FinFET than any other FinFET, the first longitudinal axis intersecting at least one fin of the second plurality of semiconductor fins; and a third FinFET over the substrate, the third FinFET comprising a third plurality of semiconductor fins and a second dummy gate structure over and perpendicular to the third plurality of semiconductor fins, each semiconductor fin of the third plurality of semiconductor fins having a rectangular shape in a top-down view, the third plurality of semiconductor fins consisting of all semiconductor fins under the second dummy gate structure, the third plurality of semiconductor fins being perpendicular to the second plurality of semiconductor fins, and the third FinFET being electrically isolated from all active devices, the third FinFET being nearer to a second side of the first FinFET than any other FinFET, the second side of the first FinFET being opposite the first side of the first FinFET, the first longitudinal axis intersecting at least one fin of the third plurality of semiconductor fins, wherein the second FinFET is aligned relative to the first FinFET such that a center axis of the first FinFET substantially bisects the second FinFET, the center axis being parallel to the first plurality of semiconductor fins and defined by a mid-line between an outer edge of a first outer fin of the first plurality of semiconductor fins and an outer edge of a second outer fin of the first plurality of semiconductor fins, the second outer fin being on an opposite side of the first FinFET than the first outer fin, and wherein the third FinFET is aligned relative to the first FinFET such that a longitudinal axis of each fin of the first plurality of semiconductor fins is aligned to be collinear with a corresponding longitudinal axis of a corresponding fin of the third plurality of semiconductor fins of the third FinFET.

8. The FinFET device of claim 7 further comprising:
the first FinFET further comprising:
a first semiconductor fin having a first sidewall;
a second semiconductor fin having a second sidewall, the second fin laterally adjacent and parallel to the first fin, the second sidewall a respective corresponding sidewall of the first sidewall; and
a first spacing measured from the first sidewall to the second sidewall, wherein the first FinFET is laterally spaced from the second FinFET by a second spacing, the second spacing being from one tenth the first spacing to five times the first spacing.

9. The FinFET device of claim 8, wherein the third FinFET is laterally spaced from the first FinFET by the second spacing.

10. The FinFET device of claim 8 further comprising a first dummy section over the substrate, the first dummy section electrically isolated from all active devices, and the first dummy section laterally spaced from the first FinFET by the second spacing, and the first dummy section having a square shape as viewed from a top down perspective.

11. A FinFET device comprising:
a first FinFET over a substrate, the first FinFET comprising a first plurality of semiconductor fins and an active gate structure over top surfaces and sidewalls of the first plurality of semiconductor fins, one fin of the first plurality of semiconductor fins having a first longitudinal axis, the first plurality of semiconductor fins consisting of all semiconductor fins underlying the active gate structure, each of the first plurality of semiconductor fins having a rectangular shape in a top-down view and being perpendicular to the active gate structure, the first FinFET being configured to be an active device;

a second FinFET over the substrate, the second FinFET comprising a second plurality of semiconductor fins having a topmost surface that is co-planar with a topmost surface of the first plurality of semiconductor fins and a first dummy gate structure over and perpendicular to the second plurality of semiconductor fins, the second plurality of semiconductor fins consisting of all semiconductor fins underlying the first dummy gate structure, each of the second plurality of semiconductor fins having a rectangular shape in a top-down view and being perpendicular to the first plurality of semiconductor fins, the second FinFET being electrically isolated from all active devices, the second FinFET being nearer to a first side of the first FinFET than any other FinFET, the first longitudinal axis intersecting at least one fin of the second plurality of semiconductor fins; and a third FinFET over the substrate, the third FinFET comprising a third plurality of semiconductor fins having a topmost surface that is co-planar with the topmost surface of the first plurality of semiconductor fins and a second dummy gate structure over and perpendicular to the third plurality of semiconductor fins, the third plurality of semiconductor fins consisting of all semiconductor fins underlying the second dummy gate structure, each of the third plurality of semiconductor fins having a rectangular shape in a top-down view and being parallel to the first plurality of semiconductor fins, the third FinFET being electrically isolated from all active devices, and no one FinFET sharing a common gate structure with another FinFET, the third FinFET being nearer to a second side of the first FinFET than any other FinFET, the second side of the first FinFET being opposite the first side of the first FinFET, the first longitudinal axis intersecting at least one fin of the third plurality of semiconductor fins, wherein, in top-down view, the second FinFET is aligned relative to the first FinFET such that a center axis of the first FinFET substantially bisects the second FinFET, the center axis being parallel to the first plurality of semiconductor fins and defined by a mid-line between an outer edge of a first outer fin of the first plurality of semiconductor fins and an outer edge of a second outer fin of the first plurality of semiconductor fins, the second outer fin being on an opposite side of the first FinFET than the first outer fin, wherein the third FinFET is aligned relative to the first FinFET such that a longitudinal axis of each fin of the first plurality of semiconductor fins is aligned to be collinear with a corresponding longitudinal axis of a corresponding fin of the third plurality of semiconductor fins of the third FinFET.

12. The FinFET device of claim 11, wherein the second plurality of semiconductor fins are longer and wider than the first plurality of semiconductor fins.

13. The FinFET device of claim 11, wherein the second plurality of semiconductor fins are shorter than the first plurality of semiconductor fins and have a same width as the first plurality of semiconductor fins.

14. The FinFET device of claim 11, wherein the active gate structure is laterally separated from the second and third FinFETs.

15. The semiconductor device of claim 1 further comprising:
a dielectric layer over the substrate and surrounding lower portions of each of the active semiconductor fins of the active FinFET and lower portions of each of the dummy semiconductor fins of the first, the second, the third, and the fourth dummy FinFETs, the active gate structure adjoining a top surface of the dielectric layer, and portions of the top surface of the dielectric layer spacing the active gate structure from each of the first, the second, the third, and the fourth dummy FinFETs.

16. The semiconductor device of claim 1, wherein the at least one contact portion of the active gate structure comprises four sidewalls, each sidewall of the four sidewalls being perpendicular to adjacent sidewalls the active gate structure, the fourth dummy FinFET being nearer to a first sidewall of the at least one contact portion than any other dummy FinFET.

17. The semiconductor device of claim 16 further comprising:
a fifth dummy FinFET over the substrate, wherein the fifth dummy FinFET comprises a fifth plurality of dummy semiconductor fins, the fifth dummy FinFET laterally adjacent the fourth side of the active FinFET, the fifth dummy FinFET being nearer to a second sidewall of the at least one contact portion than any other dummy FinFET, the second sidewall being opposite the first sidewall; and
a sixth dummy FinFET over the substrate, wherein the sixth dummy FinFET comprises a sixth plurality of dummy semiconductor fins, the sixth dummy FinFET laterally adjacent the fourth side of the active FinFET, the sixth dummy FinFET being nearer to a third sidewall of the at least one contact portion than any other dummy FinFET, the third sidewall being interposed between the first and second sidewalls, a fourth sidewall of the at least one contact portion facing the active FinFET and being opposite the third sidewall.

18. The semiconductor device of claim 1, further comprising:
a fifth dummy FinFET over the substrate, wherein the fifth dummy FinFET comprises a fifth plurality of dummy semiconductor fins, each dummy semiconductor fin of the fifth plurality of dummy semiconductor fins having a rectangular shape in top-down view, being parallel to each of the active semiconductor fins, and having a topmost surface co-planar with the topmost surface of each of the active semiconductor fins, the fifth dummy FinFET laterally adjacent both the first dummy FinFET and the third dummy FinFET or the fourth dummy FinFET, wherein in top-down view, a first line drawn perpendicular to each of the active semiconductor fins through first end portions of each of the active semiconductor fins, the first end portions proximate the first dummy FinFET, intersects the fifth plurality of dummy semiconductor fins, and wherein in top-down view, a second line drawn parallel to each of the first plurality of dummy semiconductor fins intersects at least one fin of the first plurality of dummy semiconductor fins and the fifth plurality of dummy semiconductor fins; and
a sixth dummy FinFET over the substrate, wherein the sixth dummy FinFET comprises a sixth plurality of dummy semiconductor fins, each dummy semiconductor fin of the sixth plurality of dummy semiconductor fins having a rectangular shape in top-down view and having a topmost surface co-planar with the topmost surface of each of the active semiconductor fins, the sixth dummy FinFET laterally adjacent both the second dummy FinFET and the third dummy FinFET or the fourth dummy FinFET, wherein in top-down view, a third line drawn perpendicular to each of the active semiconductor fins through second end portions of each of the active semiconductor fins, the second end portions proximate the second dummy FinFET, intersects at least one fin of the sixth plurality of dummy semiconductor fins, and wherein in top-down view, a fourth line drawn perpendicular to each of the second plurality of dummy semiconductor fins intersects the second plurality of dummy semiconductor fins and at least one fin of the sixth plurality of dummy semiconductor fins, wherein a longitudinal axis of each of the fifth plurality of dummy semiconductor fins is aligned to a corresponding longitudinal axis of a corresponding fin of the sixth plurality of dummy semiconductor fins to be collinear, and wherein the longitudinal axis of each fin of the fifth plurality of dummy semiconductor fins intersects every fin of the third plurality of dummy semiconductor fins.

19. The FinFET device of claim 7, further comprising:
a further plurality of dummy fins formed to surround a space around the first FinFET, the space being defined by a spacing from the first FinFET on the first side, the second side, a third side, and at least partially on a fourth side of the first FinFET, the fourth side of the first FinFET opposite the third side.

20. The FinFET device of claim 11, further comprising:
a fourth FinFET over the substrate, the fourth FinFET comprising a fourth plurality of semiconductor fins having a topmost surface that is co-planar with a topmost surface of the first plurality of semiconductor fins and a fourth dummy gate structure over and perpendicular to the fourth plurality of semiconductor fins, the fourth plurality of semiconductor fins consisting of all semiconductor fins underlying the fourth dummy gate structure, each of the fourth plurality of semiconductor fins having a rectangular shape in top-down view, and being parallel to the first plurality of semiconductor fins, and the fourth FinFET being electrically isolated from all active devices, wherein in top-down view, a first line drawn perpendicular to each of the first plurality of semiconductor fins through first end portions of each of the first plurality of semiconductor fins, the first end portions proximate the second FinFET, intersects the fourth plurality of semiconductor fins, and wherein in top-down view, a second line drawn parallel to each of the second plurality of semiconductor fins intersects at least one fin of the second plurality of semiconductor fins and the fourth plurality of semiconductor fins;
a fifth FinFET over the substrate, the fifth FinFET comprising a fifth plurality of semiconductor fins having a topmost surface that is co-planar with a topmost surface of the first plurality of semiconductor fins and a fifth dummy gate structure over and perpendicular to the fifth plurality of semiconductor fins, the fifth plurality of semiconductor fins consisting of all semiconductor fins underlying the fifth dummy gate structure, each of the fifth plurality of semiconductor fins having a rectangular shape in top-down view, and the fifth FinFET being electrically isolated from all active devices, wherein in top-down view, a third line drawn perpendicular to each of the first plurality of semiconductor fins through second end portions of each of the first plurality of semiconductor fins, the second end portions proximate the third FinFET, intersects at least one fin of the fifth plurality of semiconductor fins, and wherein in top-down view, a fourth line drawn perpendicular to each of the third plurality of semiconductor fins intersects at least one fin of the fifth plurality of semiconductor fins and the third plurality of semiconductor fins; and a further plurality of dummy fins formed to surround a space around the first FinFET, the space being defined by a spacing from the first FinFET on the first side, the second side, a third side, and at least partially on a fourth side of the first FinFET, the fourth side of the first FinFET opposite the third side, wherein each of the fourth plurality of semiconductor fins is aligned to a corresponding fin of the fifth plurality of semiconductor fins such that a first side of each fin of the fourth plurality of semiconductor fins is in a same respective plane as a first side of the corresponding fin of the fifth plurality of semiconductor fins.

\* \* \* \* \*